US007003625B2

(12) United States Patent
King

(10) Patent No.: US 7,003,625 B2
(45) Date of Patent: Feb. 21, 2006

(54) SEARCHING SMALL ENTITIES IN A WIDE CAM

(75) Inventor: Lawrence King, Carp (CA)

(73) Assignee: Mosaid Technologies, Inc., Kanata (CA)

( * ) Notice: Subject to any disclaimer, the term of this patent is extended or adjusted under 35 U.S.C. 154(b) by 343 days.

(21) Appl. No.: 10/386,378

(22) Filed: Mar. 10, 2003

(65) Prior Publication Data

US 2004/0123024 A1 Jun. 24, 2004

Related U.S. Application Data

(60) Provisional application No. 60/434,840, filed on Dec. 19, 2002.

(51) Int. Cl.
*G06F 12/00* (2006.01)

(52) U.S. Cl. ....................... 711/108; 711/100; 711/154; 709/201

(58) Field of Classification Search ................ 711/100, 711/108, 154, 201; 709/201
See application file for complete search history.

(56) References Cited

U.S. PATENT DOCUMENTS

| | | | | |
|---|---|---|---|---|
| 5,414,704 | A | 5/1995 | Spinney | |
| 6,434,662 | B1 | 8/2002 | Greene et al. | |
| 6,438,674 | B1 | 8/2002 | Perloff | |
| 6,473,846 | B1 | 10/2002 | Melchior | |
| 6,647,457 | B1 * | 11/2003 | Sywyk et al. | 711/108 |
| 6,714,430 | B1 * | 3/2004 | Srinivasan et al. | 365/49 |
| 6,804,135 | B1 * | 10/2004 | Srinivasan et al. | 365/49 |
| 6,867,989 | B1 * | 3/2005 | Roy | 365/49 |
| 2001/0002476 | A1 * | 5/2001 | Abdat | 711/108 |
| 2002/0181263 | A1 * | 12/2002 | Yanagawa | 365/49 |
| 2004/0019737 | A1 * | 1/2004 | Kastoriano et al. | 711/104 |

OTHER PUBLICATIONS

"Intra-Device Configurability in Network Search Engines," *Application Note NCS012 Jan. 2001*, pp. 1-6.

* cited by examiner

*Primary Examiner*—Tuan V. Thai
(74) *Attorney, Agent, or Firm*—Hamilton, Brook, Smith & Reynolds, P.C.

(57) ABSTRACT

A plurality of entities are stored in a single addressable location in a Content Addressable Memory (CAM). A column in a CAM entry is selected for storing an entity based on the property of the entity to distribute the entities among the columns to maximize memory utilization. A match for a search key stored in one of the plurality of columns can be found in a single search operation.

14 Claims, 4 Drawing Sheets

SEARCHING SMALL ENTITIES IN A WIDE CAM

RELATED APPLICATION

This application claims the benefit of U.S. Provisional Application No. 60/434,840, filed on Dec. 19, 2002. The entire teachings of the above application are incorporated herein by reference.

BACKGROUND OF THE INVENTION

A Content Addressable Memory ("CAM") includes a plurality of CAM cells arranged in rows and columns. As is well-known in the art, a CAM cell can be dynamic memory based or static memory based and can be a binary cell or a ternary cell. A binary CAM cell has two possible logic states '1' and '0'. A ternary CAM cell has three possible logic states '0', '1' and don't care ('X') encoded in two bits.

A CAM entry can include a plurality of CAM cells. For example, a 72-ternary bit entry includes 72 ternary CAM cells. A search and compare feature allows all of the CAM cells in the CAM to be searched for an entry storing data that matches a search key. If an entry matching the search key is stored in the CAM, outputs typically provide the address of the matching entry, that is, the match address, a match flag indicating whether there is a match and a multiple match flag indicating whether there is more than one match. The match address may be used to find data associated with the search key stored in a separate memory in a location specified by the match address.

Each entry in the CAM has an associated match line coupled to each CAM cell in the entry. Upon completion of the search, the state of the match line for the entry indicates whether the entry matches the search key. The match lines from all entries in the CAM are provided to a match line detection circuit to determine if there is a matching entry for the search key in the CAM and then the result of the match line detection circuit is provided to a priority encoder. If there are multiple match entries for the search key in the CAM, the priority encoder selects the match entry with the highest, priority. The priority encoder also provides the match address and a match flag. The match flag is enabled when there is at least one match/hit.

Each entry in the CAM is searched for a match for the search key. Typically high density CAMs are configured for 72-bit, 144-bit or 288-bit width entries. For example, the Mosaid CLASS-IC DC9288 is a 9 M bit DRAM-based CAM configurable as 128K 72-bit entries, 64K 144-bit entries or 32K 288-bit entries. The size of the priority encoder is proportional to the number of entries. Thus, in order to decrease the cost of the CAM, the width of each entry is increased to decrease the total number of entries.

CAMs have many applications including address lookups. For example, a CAM can be used to select a next hop address corresponding to an Internet Protocol (IP) destination addresses. There are two versions of the Internet Protocol. Internet Protocol Version 4 (IPv4) uses a 32-bit destination address and Internet Protocol Version 6 (IPv6) uses a 128-bit destination address. With a 32-bit destination address, there are $2^{32}$ (4G) possible destination addresses and with a 128-bit destination address there are $2^{128}$ possible IPv6 destination addresses. While IP addresses are typically multiples of 32 bits, CAM entries are typically multiples of 36 bits. The extra bits in CAM entries permit user specific data to be stored along with the IP address.

For example, a 32-bit IPv4 destination addresses can be stored in a CAM configured with 128K 72-bit entries with one 32-bit IPv4 destination address stored in each 72-bit CAM entry. By storing one 32-bit IPv4 destination address per CAM entry, a matching entry for a search key can be found in a single search of all entries in the CAM. However, this is an inefficient use of memory because less than 50% of the memory is used, with only 32-bits of each 72-bit entry storing valid data.

Memory efficiency can be increased by storing two 32-bit IPv4 destination addresses per entry in the CAM. For example, bits 35:0 of the 72-bit CAM entry can be assigned for storing one of the 32-bit IPv4 destination addresses and bits 71:36 can be assigned for storing the other. A masked command is issued to restrict the search for a match to the appropriate bits in each CAM entry. With two destination addresses per CAM entry, two separate masked search commands must be issued to find a match for a search key stored in the CAM. For example, a first masked search command is issued to search for a match in the bits 35:0 of all of the 72-bit CAM entries with all other bits in the entries masked. A second masked search command is issued to search for a match in bits 71:36 of the 72-bit CAM entries with all other bits masked. Although memory use is efficient, search time is increased because of the multiple searches.

SUMMARY OF THE INVENTION

A method and apparatus for efficiently storing a plurality of entities per CAM entry and performing a single search of the CAM for the entity is presented. A column in a CAM entry is selected for storing the entity based on a property of the type of data stored in the entity. The column to search is selected using the result of the same function on a search key. By selecting only one column for the search operation, a match for the search key can be found using one masked search operation.

A Content Addressable Memory is searched for entities that are smaller than Content Addressable Memory entries. Entities are stored in respective columns of the Content Addressable Memory. A column to be searched is selected based on a property of an entity search key and the entity search key is applied to the selected column to search for a match.

The column may be selected based on a result of a hash function performed on at least a portion of the search key. The entity search key may be applied by shifting the entity search key to cells in a Content Addressable Memory search key corresponding to the selected column and performing a masked search masking nonselected columns. The hash function may evenly distribute entities across the plurality of columns in the Content Addressable Memory.

The hash function may perform a parity test or a Cyclic Redundancy Check (CRC) test on the portion of the search key. The addressable location may store IP addresses in 4 columns, with the hash function, for example, computing parity of even bits and odd bits in the 16 most significant bits of the IP address.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
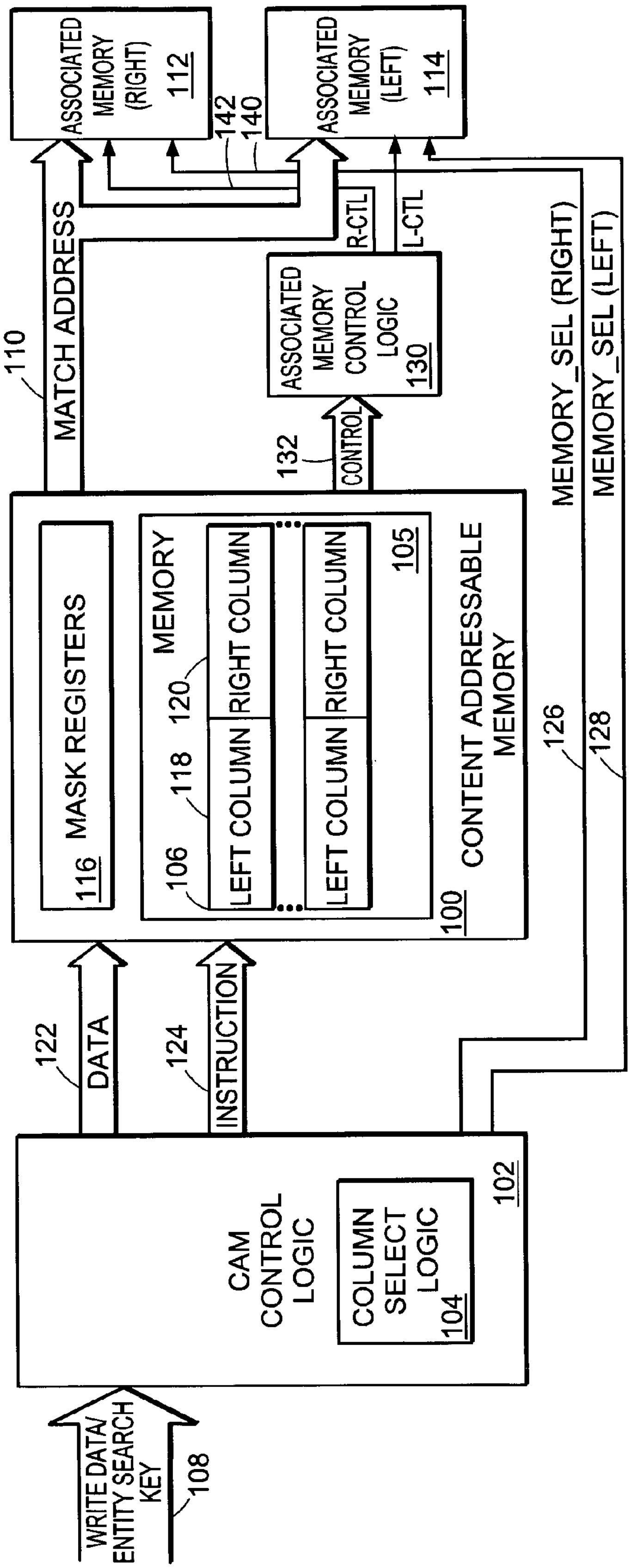
FIG. 1 is a block diagram of a Content Addressable Memory (CAM) coupled to CAM control logic, the CAM control logic includes column select logic for efficiently storing and searching for entities in a CAM according to the principles of the present invention.

FIG. 1 is a block diagram of a Content Addressable Memory (CAM) 100 coupled to CAM control logic 102, the CAM control logic 102 includes column select logic 104 for efficiently storing and searching for entities in a CAM according to the principles of the present invention. The CAM 100 includes a memory 105 having a plurality of CAM entries 106. The width of the CAM entries 106 is configurable during initialization of the CAM 100.

In a CAM, data 122 is supplied to the memory 105 through a special comparand register together with a search instruction on the instruction bus 124. The memory 105 returns a match address 110 if a match for the supplied data (CAM search key) 122 results in a match stored in a CAM entry 106 in the memory 105. The entire memory 105 can be searched in a single search cycle and the address of the CAM entry (match address 110) storing the match is used to retrieve data associated with the supplied data 122. The associated data is typically stored in a separate discrete memory 112, 114 in a location specified by the result of the search (match address 110) of the CAM.

Each CAM entry 106 in the memory 105 can store one or more entities. The number of entities that can be stored in the CAM entry is dependent on the width of the CAM entry and the width of the entities. A CAM storing a plurality of entities per CAM entry performs a single search of the memory 105 for the entity while maximizing memory utilization. A plurality of entities are stored in a CAM entry by selecting a column in the CAM entry for storing each of the entities. A search for a match for data 122 can be restricted to one entity per CAM entry by selecting one of the columns and masking non-selected columns in mask registers 116 in the CAM.

In the embodiment shown, two entities can be stored in each CAM entry 106, one in the left column 118 and the other in a right column 120. A search of CAM is limited to entities stored in the right column 120 or the left column 118 through the use of mask registers 116.

When writing to memory 105, one of the columns 118, 120 is selected for storing an entity dependent on a property of the entity. The column for storing the entity is selected based on the result of a function performed by the column select logic 104 on the entity. The same function is performed on an entity search key 108 to select the column in the CAM entry in which to search for the stored entity, allowing a match for the entity to be found in a single search cycle.

The function can be performed on any bits of the entity search key. For example, the function can select one of two columns dependent on the state of the most significant bit of the entity or the parity of selected bits. The selected bits need not be contiguous bits in the entity search key. However because a ternary bit having a 'don't care' state is not deterministic, a ternary bit does not allow selection of a single column in which to search for a match for the entity search key. If the bits selected from the entity search key 108 are binary, the entity search key 108 maps to only one column. If any of bits selected from entity search key 108 are not binary, the entity search key can map to any of the columns. Thus, in order to find a match in a single search of the CAM, an entity having non-binary bits is stored in each of the columns. In an alternative embodiment, if any of the bits selected from the entity search key are non-binary and the entity is stored in only one of the columns, a masked search can be issued to each of the columns to find a match.

In the embodiment shown in FIG. 1, the mask registers 116 include one mask register associated with the left column 118 and another mask register associated with the right column 120 in the CAM entries 106. The mask register associated with the right column limits the search for match to the right column 120 of the CAM entry by masking a search of the non-selected column (the left column 118). The mask register for the left column limits the search for a match to the left column 118 of the CAM entry.

In an embodiment in which the CAM 100 is configured to operate in 72-bit data width mode, two 32-bit entities can be stored in each CAM entry. Two mask registers 116 are initialized, one for the right column 120 and the other for the left column 118. A bit in a CAM entry 106 is masked if the corresponding bit in the mask register is set to '1' and not masked if the corresponding bit in the mask register is set to '0'. The 72-bit mask register associated with the left column 118 is initialized to 0x00000000FFFFFFFF to mask a search of the 36-bits in the right column 120 of the CAM entries 106. The 72-bit mask register associated with the right column 120 is initialized to 0xFFFFFFFF00000000 to mask a search of the 36-bits in the left column 118 of the CAM entries 106. The mask registers 116 are used during write and search operations to select the right or left column 118, 120 of the CAM entries. A single search for an entity which may be stored in either the right column 120 or the left column 118 of a CAM entry 106 is performed by issuing a masked search instruction using the appropriate mask register on the instruction bus 124.

The data associated with the CAM entries 106 is stored in associated memory 112, 114 indexed by the match address 110 output by the CAM on a successful search. As each CAM entry 106 can store two entities, each match address 110 may correspond to two stored entities. One set of the associated data 114 corresponds to the entity stored in the left column 118 and the other set corresponds to the entity stored in the right column 120 in the CAM entries. The associated memory 112, 114 selected is dependent on the column 118, 120 selected by the column select logic 104 for the search operation. Memory select signals 126, 128 select the appropriate associated memory 112, 114 dependent on the selected column 118, 120. The associated memory control logic 130 controls access through control signals (142, 144) to the associated memory 112, 114 dependent on control signals 132 issued by the CAM 100 in response to commands issued on the instruction bus 124 provided by the CAM control logic 102.

In one embodiment, the CAM 100 operates as a lookup table in a forwarding engine in a router. For each incoming packet, the router has to look up an IP destination address included in a received packet and forward the packet to the retrieved output port. The forwarding engine in the router searches for the longest prefix match for the IP destination address stored in the lookup table.

A destination address in Internet Protocol version 4 (IPv4) has 32-bits. Thus, two 32-bit IPv4 destination addresses (entities) can be stored in a 72-bit wide CAM entry, one in the most significant 36 bits (left column 118) of the CAM entry 106 and the other in the least significant 36-bits (right column 120) of the CAM entry 106. The next hop information associated with each IP destination address is stored in the corresponding associated memory (right) 112 and associated memory (left) 114. The width of the associated data is dependent on the width of the next hop information. For example, the next hop information for a switch can include a bit per output port in the switch. A single 9 Mega bit CAM 100 provides a lookup table including 128K 72-bit wide CAM entries 106 which can store a total of 256K IPv4 destination addresses (two per CAM entry). As is well-known in the art, the size of the lookup table can be increased by cascading multiple CAMs.

When a new packet is received, the 32-bit IPv4 destination address is supplied as the search key 122 to the CAM 100 to search for a forwarding entry stored in one of the CAM entries 106. The match for the destination address may be stored in a left column 118 or a right column 120 of a CAM entry 106. A single masked search is performed in one column selected by the column select logic 104 in all or a portion of the CAM entries.

Search instructions are pipelined and for every incoming packet, the column select logic 104 performs a function on the destination address to select a column in the CAM entries to search. A masked search is issued to search the selected column using the mask register associated with the selected column by directing the IPv4 destination address (search key) to the selected column of the CAM entry and masking the search of all other bits in the CAM entry.

Figure 2:
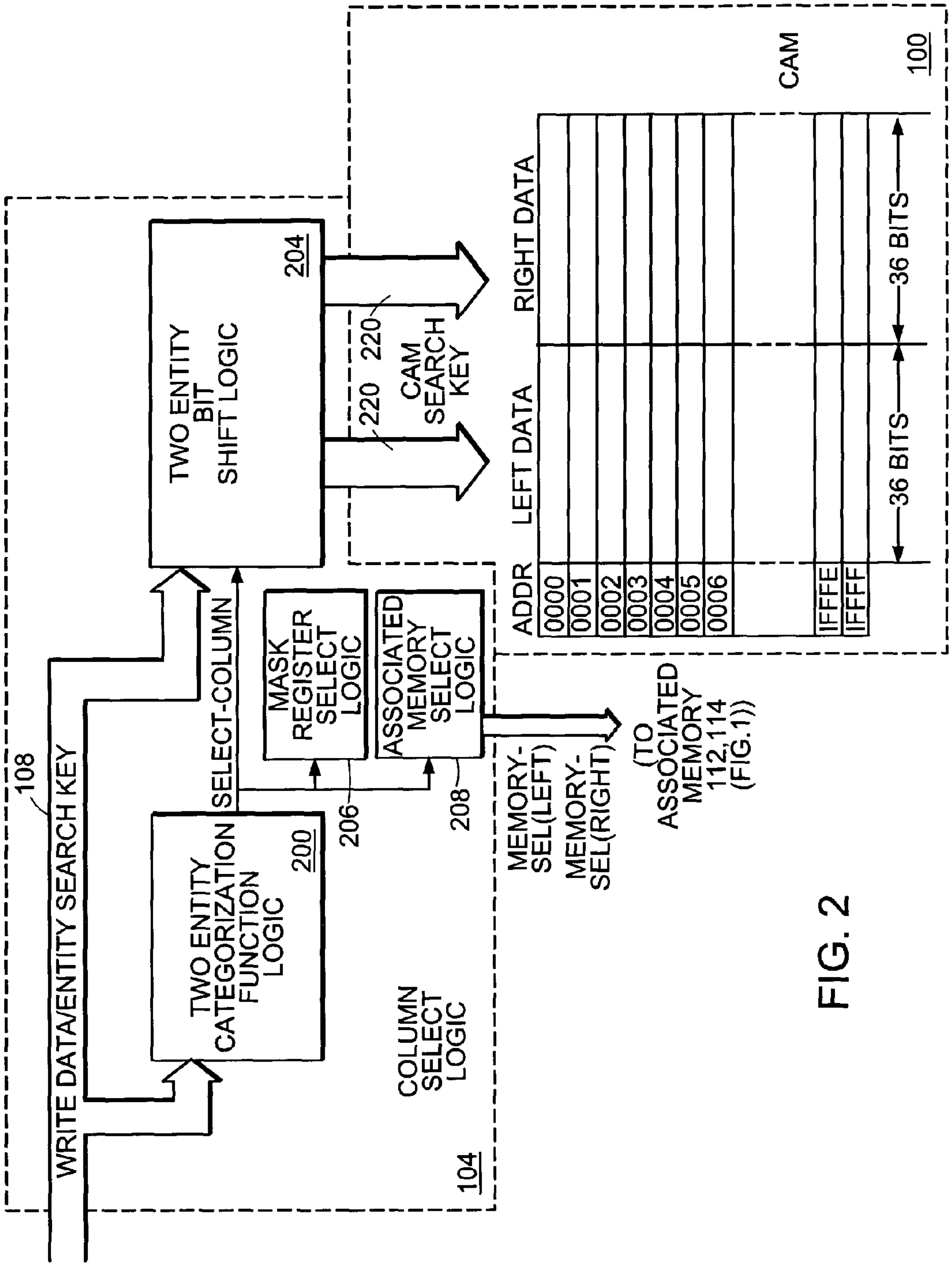
FIG. 2 is a block diagram of an embodiment of the column select logic for storing two entities per CAM entry.

FIG. 2 is a block diagram of an embodiment of the column select logic 104 for storing two entities per CAM entry. A portion or all of the entity search key 108 can be used as input to the two entity categorization function logic 200. The output (select column) of the categorization function logic 200 selects the column of the CAM entries for storing and searching for a match for the entity search key 108. The column is selected for writing the entity and for searching for a match for the entity search key 108. During initialization of the CAM, the two entity categorization function logic 200 determines the column of the CAM entries in which to write the data.

The categorization function is dependent on the number of entities to be stored per CAM entry. For example, in one embodiment, the categorization function performs a parity test which provides a one-bit result to select one of two entities. Approximately half of the entities have even parity. Thus, approximately half of the entities (those having even parity) are stored in one column and the other entities (those having odd parity) are stored in the other column, to create more or less evenly distributed entities.

Each CAM entry has an associated empty flag that is set when memory 105 is cleared. In order to determine whether a column in a CAM entry 106 is empty, one or more bits of the CAM entry are defined as status bits. Preferably bits not used for storing the entities are used for this purpose. For example, in a 9 Mega bit CAM configured with 128 K 72-bit CAM entries in locations 0x00000–0x1FFFF, each CAM entry can store two 32-bit entities and eight of the 72 bits are available as status bits.

In one embodiment a valid status bit is associated with each column. A first write to an empty CAM entry 106, clears the empty flag, marks the valid status bit of the column in which the entity is being written as valid and the valid status bits in the other column as invalid.

When adding a new entity to the left column, a first search is performed to find a CAM entry that is "not empty" and has a valid status bit set to "invalid". Upon finding the CAM entry, the contents of the CAM entry are read, the entity is written to the left column with the valid status bit associated with the left column set to "valid":

For example, in the embodiment for storing two entities per CAM entry, if the status bit in the left column of CAM entry A is marked "invalid", a search for a match in the left column looks for a CAM entry that is marked "not empty" and "valid" and thus does not find a match in the left column of CAM entry A. Later, during a search operation, the two entity categorization function logic 200 determines which column of the CAM entries is to be searched.

During a search operation, the two entity categorization function logic 200 performs the same parity calculation on the entity search key 108 to determine in which column to search. If the result of the parity test is odd, the two entity bit shift logic 204 shifts the entity search key 108 to the appropriate column, a masked search command is issued with the CAM search key 220 to search the column storing entities with odd parity.

Figure 3:
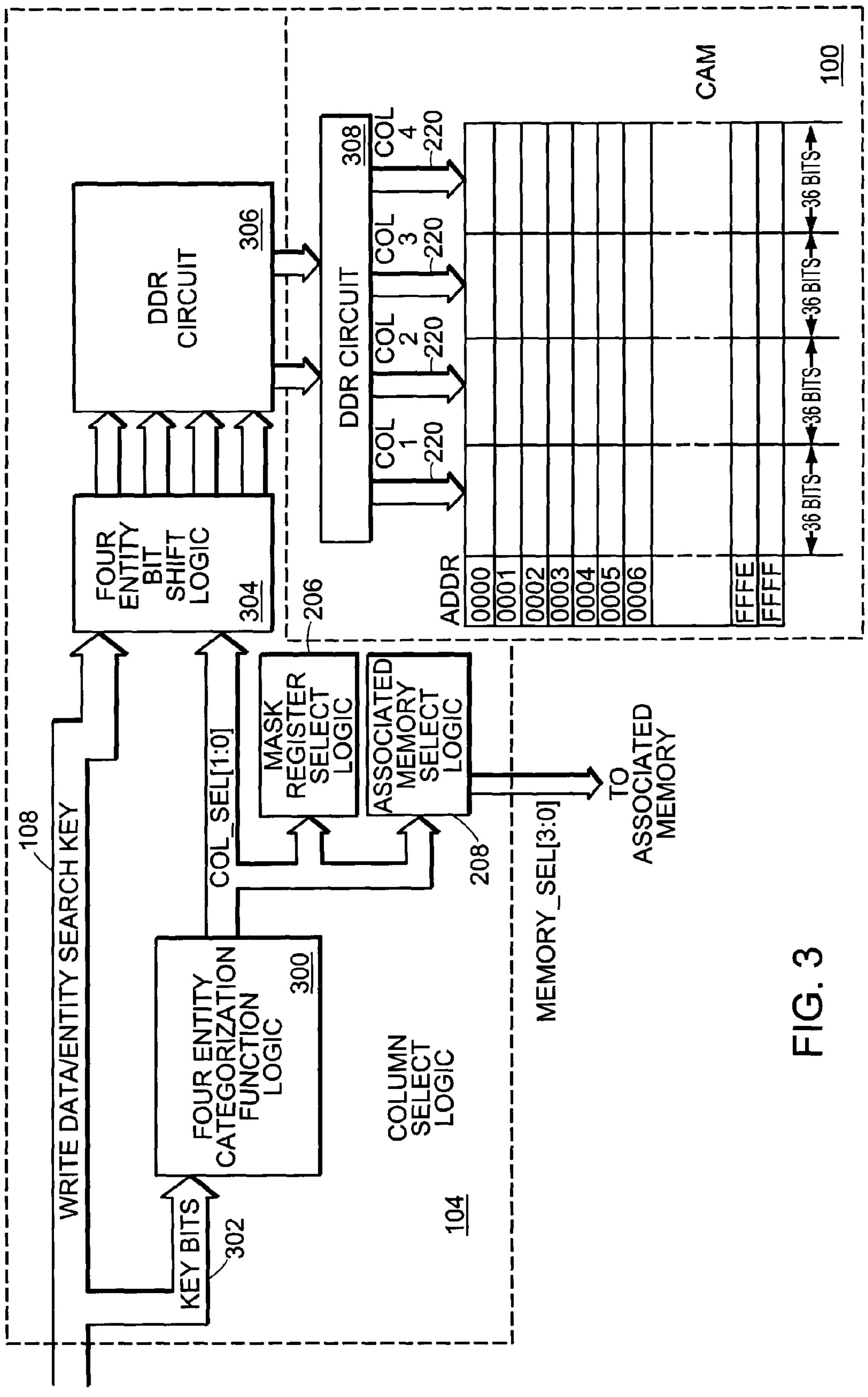
FIG. 3 is a block diagram of another embodiment of the column select logic for storing four entities per CAM entry.

FIG. 3 is a block diagram of another embodiment of the column select logic for storing four entities per CAM entry. Four entity categorization function logic 300 performs a-function on key bits of the entity search key 108 to select a column in a CAM entry storing a match based on the contents of the entity. After the column has been selected, four entity bit shift logic 304 shifts the entity search key 108 to the appropriate columns of the CAM entry. In order to ensure an efficient use of memory, the key bits 302 used by the 4 entity categorization function logic 300 are selected so that the data is evenly distributed over the columns in the CAM. The selection of key bits 302 is dependent on the nature of the data. Generally, key bits that result in evenly distributed entities are the most desirable.

Any bits of the entity search key 108 can be selected as key bits 302. The selected key bits 302 need not be contiguous bits in the entity search key. However because a ternary bit having a 'don't care' state is not deterministic, a ternary bit does not allow selection of a single column in which to search for a match for the entity search key. If the key bits 302 selected from the entity search key are binary, the entity search key maps to only one column. If any of the key bits 302 selected from the entity search key are not binary, the entity search key can map to any of the columns. Thus, in order to find a match in a single search of the CAM, the entity is stored in each of the columns.

The four entity categorization function logic 300 has a two-bit result (Column_Sel [1:0]). The categorization function is selected dependent on the nature of the data to spread the data across the columns to maximize memory efficiency.

In one embodiment, the entity search key 108 is a 32-bit IPv4 destination address. The CAM is a 9 Megabit Cam configured with 64K 144-bit CAM entries at locations 0x0000–0xFFFF. With 32-bits there are 4 Giga ($2^{32}$) possible destination addresses, 256K of which can be stored in a 100% efficient 64K×144-bit wide CAM, four in each 144-bit CAM entry. The 16 Most Significant Bits (MSB) of the IPv4 destination address are selected as the key bits 302 and are input to the 4 entity categorization function logic 300. Typically, 99% of the 16 MSBs of IPv4 destination addresses are binary (unmasked), for example, 128.114.xxx.xxx.

Any organization worldwide that operates networks including Internet Service Providers (ISP), universities and businesses can publicly register their routing information in the Routing Arbitrator Database (RADb) portion of the Internet Routing Registry (IRR). The RADb is a public registry of routing information for networks in the Internet. Table 1 below illustrates a snapshot of the distribution of IP addresses stored in the RADb. The entry with prefix length '0' is the default entry:

TABLE 1

Prefix length distribution in the RADb routing table.

| Prefix length | Number of entries | Percentage (%) |
|---|---|---|
| 0 | 1 | 0.002 |
| 1 | 2 | 0.004 |
| 2 | 1 | 0.002 |
| 8 | 26 | 0.054 |
| 9 | 2 | 0.004 |
| 10 | 2 | 0.004 |
| 11 | 3 | 0.006 |
| 12 | 20 | 0.041 |
| 13 | 31 | 0.064 |
| 14 | 94 | 0.193 |
| 15 | 171 | 0.352 |
| 16 | 5379 | 11.070 |
| 17 | 352 | 0.724 |
| 18 | 758 | 1.560 |
| 19 | 1882 | 3.873 |
| 20 | 1208 | 2.486 |
| 21 | 1530 | 3.149 |
| 22 | 2250 | 4.630 |
| 23 | 3052 | 6.281 |
| 24 | 31651 | 65.136 |
| 25 | 66 | 0.136 |
| 26 | 40 | 0.082 |
| 27 | 32 | 0.066 |
| 28 | 17 | 0.035 |
| 29 | 11 | 0.023 |
| 30 | 11 | 0.023 |
| 31 | 0 | 0.000 |
| Total | 48592 | 100 |

A categorization function is selected to distribute the 32-bit IPv4 addresses in CAM such that four IPv4 addresses are stored per CAM entry. The categorization function selects the column in which to store the IPv4 address and the column in which to search for the IPv4 address dependent on a property of the IPv4 address. The four-entity categorization function select logic 300 performs two parity checks. An even parity check is performed on all the even (0, 2, 4, 6, 8, 10, 12 and 14) bits in the 16 MSBs of the IPv4 destination address. An odd parity check is performed on all of the odd (1, 3, 5, 7, 9, 11, 13 and 15) bits in the sixteen MSBs of the IPv4 destination address. The result of the even parity check (PE) and the result of the odd parity check (PO) are combined to provide the two bit column select as shown in Table 2 below.

TABLE 2

| PE | PO | Column Select |
|---|---|---|
| 0 | 0 | 0 |
| 0 | 1 | 1 |
| 1 | 0 | 2 |
| 1 | 1 | 3 |

The 2-bit col_sel selects one of the four columns per the CAM entry in the memory in which to search. A masked search command is issued to the CAM to search the selected column and mask all nonselected columns in all or a portion of the CAM entries for a match for the entity search key 108.

The four entity bit shift logic 304 shifts the entity search/write data to the appropriate bits of the 144-bit wide CAM entry dependent on the state of the select bits. After the entity search key 108 has been shifted to the appropriate columns of the CAM entry, a Double Data Rate (DDR) circuit 306 converts the 144-bit data to a 72-bit DDR format for transport from the CAM control logic 102 (FIG. 1) to the CAM 100. Another DDR circuit 308 in the CAM 100 converts the 72-bit format DDR data back to 144-bit format with the entity search key in the selected column of the CAM search key 200.

The column select bits (col_sel) are also coupled to mask register select logic 206. The mask register select logic 206 selects the mask register for the masked search instruction issued to the CAM with the entity search key 108. The column select bits (col_sel) are also coupled to associated memory select logic 208 to select the associated memory corresponding to the selected column.

As shown in Table 1, some of the received IPv4 addresses have a prefix length that is less than 16 bits. If the IPv4 address has less than 16 key bits defined, the four entity categorization function logic 300 may return indeterminate results because some of the key bits are unknown. However, as shown in the representative sample in Table 1 only about 1% of IPv4 addresses have fewer than 16 key bits. Thus, an IPv4 destination address with less than 16 key bits is written in each of the plurality of columns in the selected CAM entry. Thus, in a particular search, a search in any one of the columns in a CAM entry will find the match irrespective of the column selected by the four entity categorization function.

Another mask register is used for CAM write operations. The mask can be deduced from the prefix length. The mask register is written dependent on the number of significant bits in the prefix of the IPv4 destination address just before the write operation.

CAM table initialization requires three operations to write each CAM entry: (1) write to mask register (2) write to an address register and (3) read/write/modify memory at address register.

In an embodiment storing 32-bit IPv4 addresses, the 32-bit data stored in each column may not contain 32 prefix bits (typically the address may only include 16–24 prefix bits). Thus, each entity may have a different number of prefix bits, to store a new entity in the CAM entry. To write a new entity to a column in the CAM entry, the data and the mask information is read from the CAM entry. Both the data and the mask fields are modified and then the new entity and the previously stored entity (two 32-bit entries) are written to the CAM entry.

In a CAM implemented as a longest prefix match table storing IPv4 destination addresses, a CAM entry in which to add an IPv4 destination address is selected based on priority. For example, an IPv4 destination address with 23 prefix bits is stored in a CAM entry at an address with higher priority than an IPv4 destination address with 18 prefix bits so that a search for the longest prefix match results in the IPv4 destination address with 23 prefix bits stored in the CAM entry with higher priority.

The number of entities that can be stored per CAM entry and selected by the categorization function select logic can be increased beyond four by performing further functions on the entity search key to create further select bits. For example, a third select bit can be the result of a parity check on every third bit in the 16 key bits.

In alternate embodiments, more complex categorization functions such as Cyclic Redundancy Check (CRC-16 or CRC-32), or any other function that evenly distributes the entity search key over a plurality of columns in CAM entries can be used.

Figure 4:
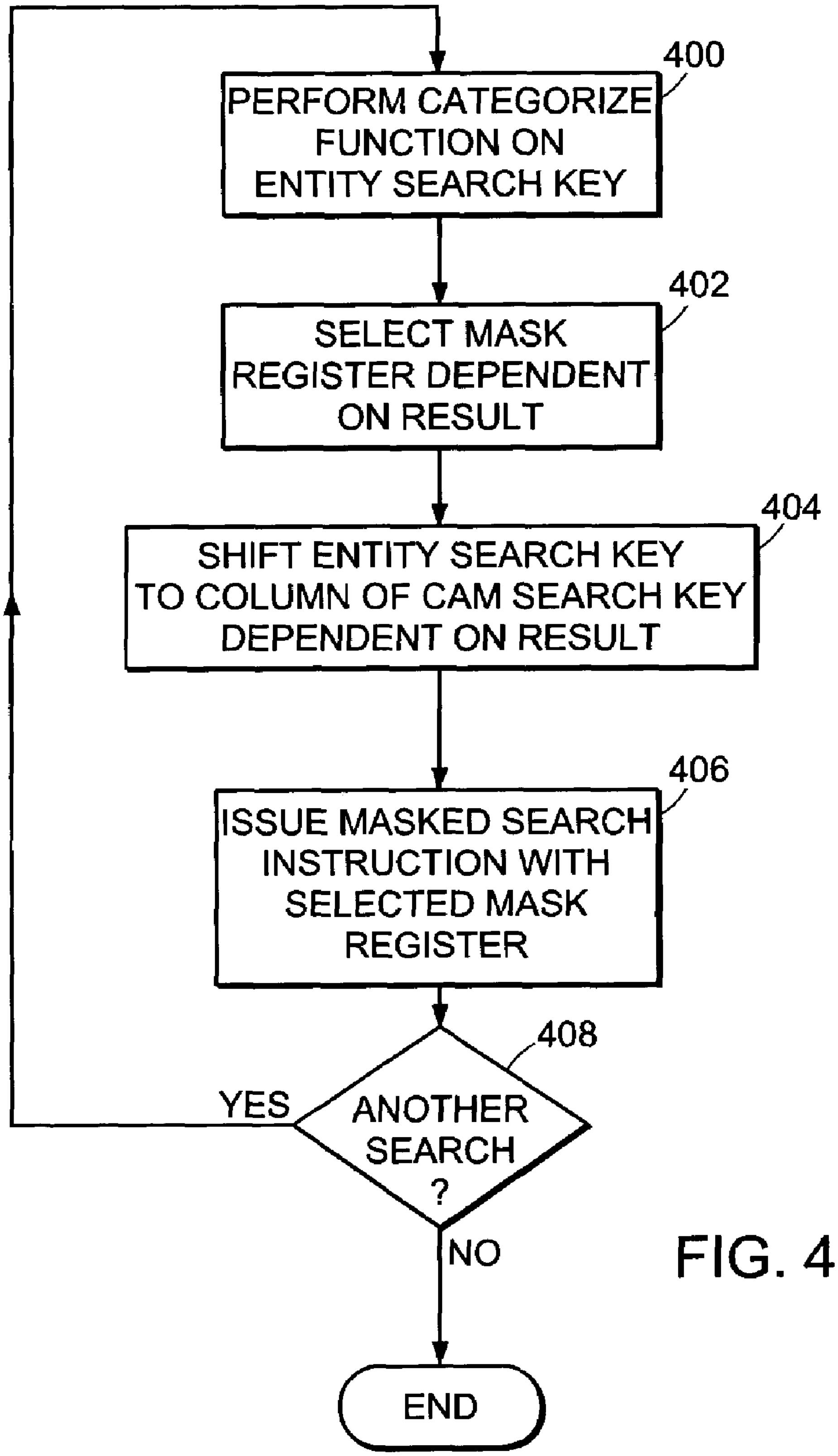
FIG. 4 a flow chart illustrating a method for efficiently performing a single search of CAM storing a plurality of entities per CAM entry.

FIG. 4 is a flowchart illustrating a method for efficiently performing a single search of CAM storing a plurality of entities per CAM entry. The flowchart is described in conjunction with the embodiment of the column select logic 104 shown in FIG. 2.

At step 400, the two-column categorization function logic 200 performs a categorization function on the entity search key 108. The categorization function can be performed on all bits of the entity search key or selected key bits of the entity search key. The selected key bits are dependent on a property of the entities stored in the CAM and are selected to provide an even distribution of the entities in the CAM. The state of a select signal output as a result of the categorization function selects a column in the CAM in which to search for a match for the entity search key 108.

At step 402, the mask register select logic 206 selects the appropriate mask register dependent on the state of the select column signal for the masked search instruction issued to the CAM in order to search for a match for the entity search key in the selected column and mask a search of nonselected columns. The selected mask register is encoded in the masked search instruction issued to the CAM with the entity search key. The associated memory select logic 208 selects the associated memory storing data associated with the entity search key dependent on the state of the select column signal.

At step 404, the two entity bit shift logic 204 shifts the entity search key to the column corresponding to the selected column of a CAM search key 202 dependent on the state of the select column signal.

At step 406, with the entity search key shifted to the selected column, the CAM control logic 102 (FIG. 1) issues the masked search instruction to search the selected column in the CAM.

At step 408, the CAM select logic 102 determines if there is another entity search key 108 to process. If so, processing continues with step 400 to process the next request to the CAM.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of searching a Content Addressable Memory for entities which are smaller than Content Addressable Memory entries comprising:

storing entities in respective columns of the Content Addressable Memory;

selecting a column to be searched based on a property of an entity search key wherein the column is selected based on a result of a hash function performed on less than all bits in the entity search key; and applying the entity search key to the selected column to search for a match.

2. The method of claim 1 wherein the hash function evenly distributes entities across the plurality of columns in the Content Addressable Memory.

3. The method of claim 2 wherein the hash function performs a parity test on the portion of the entity search key.

4. The method of claim 2 wherein the hash function performs a CRC test on the portion of the entity search key.

5. The method of claim 1 wherein the Content Addressable Memory has 4 columns for storing IP addresses, the hash function performed on 16 most significant bits of the entity search key.

6. The method of claim 5 wherein the hash function computes parity of even bits and parity of odd bits in the 16 most significant bits of the entity search key.

7. A method of searching a Content Addressable Memory for entities which are smaller than Content Addressable Memory entries comprising:

storing entities in respective columns of the Content Addressable Memory;

selecting a column to be searched based on a property of an entity search key; and applying the entity search key to the selected column to search for a match by shifting the entity search key to bit locations in a Content Addressable Memory search key corresponding to the selected column and performing a masked search masking nonselected columns.

8. An apparatus for searching a Content Addressable Memory for entities which are smaller than Content Addressable Memory entries comprising:

categorization function logic which selects a column of the Content Addressable Memory to be searched based on a result of a hash function performed on less than all of bits in the entity search key, the Content Addressable Memory storing entities in respective columns; and bit shift logic which applies the entity search key to the selected column to search for a match.

9. The apparatus of claim 8 wherein the hash function evenly distributes entities across the plurality of columns in the Content Addressable Memory.

10. The apparatus of claim 9 wherein the hash function performs a parity test on the portion of the entity search key.

11. The apparatus of claim 9 wherein the hash function performs a CRC test on the portion of the entity search key.

12. The apparatus of claim 8 wherein the Content Addressable Memory has 4 columns, each columns storing an IP addresses, the hash function performed on 16 most significant bits of the column.

13. The apparatus of claim 12 wherein the hash function computes parity of even bits and parity of odd bits in the 16 most significant bits of the entity search key.

14. An apparatus for searching a Content Addressable Memory for entities which are smaller than Content Addressable Memory entries comprising:

categorization function logic which selects a column of the Content Addressable Memory to be searched based on a property of an entity search key, the Content Addressable Memory storing entities in respective columns; and bit shift logic which applies the entity search key to the selected column to search for a match by shifting the entity search key to bit locations in a Content Addressable Memory search key corresponding to the selected column and performing a masked search masking non-selected columns.

* * * * *